(12) United States Patent
He et al.

(10) Patent No.: US 10,930,408 B2
(45) Date of Patent: Feb. 23, 2021

(54) TRIBOLUMINESCENCE ISOTOPE BATTERY

(71) Applicant: SOUTH UNIVERSITY OF SCIENCE AND TECHNOLOGY OF CHINA, Guangdong (CN)

(72) Inventors: Jiaqing He, Guangdong (CN); Yi Zhou, Guangdong (CN); Delong Li, Guangdong (CN); Qing Lou, Guangdong (CN)

(73) Assignee: SOUTH UNIVERSITY OF SCIENCE AND TECHNOLOGY OF CHINA, Shenzhen (CN)

( * ) Notice: Subject to any disclaimer, the term of this patent is extended or adjusted under 35 U.S.C. 154(b) by 0 days.

(21) Appl. No.: 16/656,961

(22) Filed: Oct. 18, 2019

(65) Prior Publication Data

US 2020/0051707 A1    Feb. 13, 2020

Related U.S. Application Data

(63) Continuation of application No. PCT/CN2018/086917, filed on May 15, 2018.

(51) Int. Cl.
*G21H 1/10* (2006.01)
*H01L 25/16* (2006.01)
*H01L 27/16* (2006.01)
*B81B 3/00* (2006.01)

(52) U.S. Cl.
CPC .......... *G21H 1/103* (2013.01); *B81B 3/0029* (2013.01); *G21H 1/106* (2013.01); *H01L 25/165* (2013.01); *H01L 25/167* (2013.01); *H01L 27/16* (2013.01); *B81B 2203/0118* (2013.01)

(58) Field of Classification Search
CPC ...... G21H 1/103; G21H 1/106; B81B 3/0029; H01L 25/165; H01L 25/167; H01L 27/16
See application file for complete search history.

(56) References Cited

U.S. PATENT DOCUMENTS

| 6,479,920 | B1 * | 11/2002 | Lal | ........................... G21H 1/00 310/309 |
| 2011/0241839 | A1 * | 10/2011 | Lal | ........................ H03B 5/326 340/10.1 |

FOREIGN PATENT DOCUMENTS

CN          106941017        *  7/2011

* cited by examiner

*Primary Examiner* — Jayne L Mershon
(74) *Attorney, Agent, or Firm* — Hodgson Russ LLP

(57) ABSTRACT

A triboluminescence isotope battery can include a housing defining a chamber, and one or more energy conversion devices. Each energy conversion device can include a holder, a cantilever beam, a triboluminescence component, a first photoelectric conversion component, a radioactive source, a first charge collecting component, a second charge collecting, a first thermoelectric conversion component, and a heat dissipation component.

20 Claims, 6 Drawing Sheets

TRIBOLUMINESCENCE ISOTOPE BATTERY

CROSS-REFERENCE TO RELATED APPLICATIONS

This application is a continuation application of PCT Application No. PCT/CN2018/086917, filed May 15, 2018, the entire disclosure of which is incorporated herein by reference.

FIELD

The present disclosure relates to the field of triboluminescence device, thermoelectric device, isotope battery, hybrid power system and micro/nano integration, in particular to the triboluminescence isotope battery.

BACKGROUND

A radioactive isotope is a kind of isotope of which nuclei (or energy state) spontaneously changes, thus emitting radiation rays. A radioisotope battery, for short an isotope battery, can convert the emitted ray energy at radioactive decay into an electric energy output by use of an energy conversion device, thereby achieving power supply. Isotope batteries currently have been widely used in some important fields, such as military defense, deep space and deep sea, polar region exploration, biomedical and electronics industries due to its advantages of long service life, strong environmental adaptability, good work stability, maintenance-free, miniaturization and the like.

The isotope battery was firstly proposed by British physicist Henry Moseley in 1913, with relative researches mainly made in the past 100 years. The isotope batteries have been classified into four categories by Zhou Yi et al. in 2017 according to their energy conversion modes with consideration of the energy conversion efficiency and power output in different energy conversion modes, including 1) static-type thermoelectric isotope battery (further including thermoelectric, thermionic emission, contact potential difference, thermal photovoltaic, alkali metal thermoelectric conversion isotope batteries), 2) radio-voltaic effect isotope battery (such as, Schottky, PN/PIN junction based isotope batteries), 3) dynamic thermoelectric isotope battery (such as, Brayton cycle, Stirling cycle, Rankine cycle, Magnetic fluid power generation, jet-driving piezoelectric type isotope batteries), and 4) special energy conversion mechanism isotope battery (such as, based on direct collection, radio-luminescence, external neutron source driven, decay LC circuit coupled resonance, cosmic ray/electromagnetic wave collection, piezoelectric cantilever, magnetic constrained beta ray electromagnetic radiation, magnetic separation, radiant ionization).

The current isotope batteries have a common deficiency of low energy conversion efficiency, as shown by the research results of the four categories of isotope batteries as described above. For example, even though significantly improved owing to the large support from country (especially the designed radioisotope thermoelectric generator (RTG) could have been manufactured almost perfectly in the United States of America), the static-type thermoelectric isotope battery only has a low energy-conversion efficiency, such as the enhanced multi-mission radioisotope thermoelectric generator (eMMRTG) newly reported by NASA just has energy conversion efficiency below 8%, thus causing limited application and difficulty in civilian use. The radio-voltaic effect isotope battery with an energy conversion component made of semiconductor materials is capable of miniaturizing isotope batteries thus improving its application in Micro-Electro Mechanical System (MEMS)/Nano-Electromechanical System (NEMS) and low-power devices, and has acquired achievements to some extent with the rapid development of wide-bandgap semiconductor and multi-dimensional structural material, however it still exists the shortage of degradation of semiconductor material performance under long-term radiation, thus decreasing the service life. The piezoelectric cantilever isotope battery can achieve electric energy output due to reciprocating mechanical deformation of a piezoelectric cantilever beam, thus has a wide application value in micro-nano device and vacuum leak detection, however it still exhibits low battery energy-conversion efficiency and a large energy loss. In inclusion, there is a need to research the current isotope battery.

SUMMARY

Embodiments of the present disclosure aim at solving at least one of the problems existing in the related art. For this, one purpose of the present disclosure is to provide an isotope battery. The isotope battery can break through the technologic bottleneck of single energy conversion and large energy loss existing in the traditional piezoelectric cantilever isotope battery, thus significantly improving the energy conversion efficiency and expanding its application in the micro/nano field.

In one aspect, the present disclosure in embodiments provides a triboluminescence isotope battery. According to the embodiment, the triboluminescence isotope battery includes a housing defining a chamber; and one or more energy conversion devices disposed in the chamber. Each energy conversion device includes a holder, disposed at the housing and in the chamber; a cantilever beam, having a first end region fixed at the holder, and a second end region movable in the chamber; a triboluminescence component, disposed at an upper surface of the first end region of the cantilever beam; a first photoelectric conversion component, disposed at an upper surface of the triboluminescence component; a radioactive source, disposed in the chamber and configured to emit a first charge and a second charge which have opposite polarity; a first charge collecting component, configured to enrich the first charge and disposed at a lower surface of the second end region of the cantilever beam; a second charge collecting component, configured to enrich the second charge and allow the second charge enriched thereby to attract the first charge enriched by the first charge collecting component such that the second end region of the cantilever beam moves toward the second charge collecting component; a first thermoelectric conversion component, disposed at an upper surface of the second end region of the cantilever beam; and a heat dissipation component, disposed at a surface of the first thermoelectric conversion component. Therefore, the triboluminescence isotope battery can break through the technologic bottleneck of single energy conversion and large energy loss existing in the traditional isotope batteries, with features of high energy conversion efficiency, excellent working stability and high micro/nano integration.

In some embodiments, the second charge collecting component is disposed at the housing and includes a first surface close to the first charge collecting component, and a second surface away from the first charge collecting component, wherein the radioactive source is disposed at the first surface of the second charge collecting component.

In some embodiments, the triboluminescence isotope battery further includes a first energy conversion component, disposed between the radioactive source and the second charge collecting component. According to the embodiments, the first energy conversion component is any one of a second thermoelectric conversion component, a first radio-voltaic component and a first radioluminescence component.

In some embodiments, the radioactive source and the second charge collecting component are integrated as a single component, and the triboluminescence isotope battery further comprises a first energy conversion component, wherein the first energy conversion component is disposed between the single component and the housing. According to the embodiments, the first energy conversion component in the embodiments is any one of a second thermoelectric conversion component, a first radio-voltaic component and a first radioluminescence component.

In some embodiments, the holder is formed as a hollow structure which defines a cavity, and the radioactive source is clamped in the cavity. A second energy conversion component is disposed at an upper surface of the radioactive source in the cavity and is electrically connected to the first charge collecting component, and a third energy conversion component is disposed at a lower surface of the radioactive source in the cavity and is electrically connected to the second charge collecting component. According to the embodiments, the second and third energy conversion components each are any one of a third thermoelectric conversion component, a second radio-voltaic component and a second radioluminescence component.

In some embodiments, multiple energy conversion devices are arranged in an array along a circumferential direction of the inner surface of the housing, and adjacent two columns of energy conversion devices, arranged in opposite such that the second end regions of the cantilever beams of one column of energy conversion devices close to the second end regions of the cantilever beams of the other one column of energy conversion devices, form a group of energy conversion devices.

In some embodiments, multiple energy conversion devices are connected with each other in series, parallel or the combination thereof.

In some embodiments, the housing is further provided with a first gasket and a second gasket at two ends respectively, and wherein the second gasket is provided with a nozzle controlled by a valve. For the energy conversion device adjacent to the first gasket, the first end region of the cantilever beam extends to and is embedded in the first gasket.

In some embodiments, the inner surface of the housing is coated with a nano-lead plexiglass composite and further provided with a buffing component.

In some embodiments, the radioactive source includes at least one of an alpha radioactive source and a beta radioactive source. The alpha radioactive source is at least one selected from the group consisting of $^{210}$Po, Gd$^{210}$Po, Y$^{210}$Po, La$^{210}$Po, Ce$^{210}$Po, Pr$^{210}$Po, Nd$^{210}$Po, Sm$^{210}$Po, Eu$^{210}$Po, Tb$^{210}$Po, Dy$^{210}$Po, Ho$^{210}$Po, Er$^{210}$Po, Tm$^{210}$Po, Yb$^{210}$Po, Lu$^{210}$Po, Pm$^{210}$Po, Sc$^{210}$Po, Gd$_3^{210}$Po, Y$_3^{210}$Po, La$_3^{210}$Po, Ce$_3^{210}$Po, Pr$_3^{210}$Po, Nd$_3^{210}$Po, Sm$_3^{210}$Po, Eu$_3^{210}$Po, Tb$_3^{210}$Po, Dy$_3^{210}$Po, Ho$_3^{210}$Po, Er$_3^{210}$Po, Tm$_3^{210}$Po, Yb$_3^{210}$Po, Lu$_3^{210}$Po, $^{228}$Th, $^{228}$ThO$_2$, $^{235}$U, $^{238}$Pu, $^{238}$PuO$_2$ microsphere, $^{238}$PuO$_2$—Mo ceramic, $^{238}$PuO$_2$ fuel ball, $^{238}$PuO$_2$ ceramic, $^{238}$Pu—Zr alloy, $^{238}$Pu—Ga alloy, $^{238}$Pu—Pt alloy, $^{238}$Pu—Sc alloy, $^{238}$PuN, $^{238}$PuC, $^{241}$Am, $^{242}$Cm, $^{242}$Cm$_2$O$_3$, $^{244}$Cm and $^{244}$Cm$_2$O$_3$. The beta radioactive source is at least one selected from the group consisting of $(C_4H_3{}^3H_5-)_n$, Sc$^3$H$_2$, $^{14}$C, $^{35}$S, $^{63}$Ni, $^{90}$Sr, $^{90}$Sr/$^{90}$Y, $^{90}$SrTiO$_3$, $^{90}$SrNO$_3$, $^{90}$SrNO$_3$/dicyclohexano-18-crown ether-6, $^{106}$Ru, $^{137}$Cs, $^{137}$CsCl, $^{144}$Ce, $^{144}$CeO$_2$, $^{147}$Pm, $^{147}$Pm$_2$O$_3$ and $^{151}$Sm.

In some embodiments, the triboluminescence component is made of a material selected from the group consisting of sucrose, D-glucose, lactose, maltose, L-rhamnose, tartaric acid, lithium acetate, potassium hydrogen malonate, vitamin C, sorbitol hexaacetate, phthalic acid, coumarin, acenaphthene, 9-anthracenemethanol based material, polybutadiene, epoxy resin, europium vanadium, copper vanadium, tetrahedral manganese complex, $(NH_4)_2C_2O_4$, $LiSO_4 \cdot H_2O$, $Ce(SO_4)_3 \cdot 8H_2O$, $Zn(NO_3)_2 \cdot 6H_2O$, $(UO_2)(NO_3)_2 \cdot 6H_2O$, SiC, Si, InP, GaAs, Ge, diamond, MgO, CaO, SrO, NaF, LiF, NaCl, KCl, KI, CsI, RbI, KBr, RbBr, $BaAl_2Si_2O_8$ based material, $Sr_3Al_2O_6$ based material, $SrAl_2O_4$ based material, $Ca_2SrMgSi_2O_7$ based material, $Ca_2MgSi_2O_7$ based material, $SrMgAl_{10}O_{17}$ based material, $Sr_2Mg_2(PO_4)_2$ based material, BaFCl based material, BaFBr based material, $K_2Mg_2(SO_4)_3$ based material, $BaSi_2O_2N_2$ based material, $CaO \cdot Nb_2O_5$ based material, $ZnGa_2O_4$ based material, $MgGa_2O_4$ based material, $ZnAl_2O_4$ based material, $LiNbO_3$ based material, $SrAl_2O_4$ based material and ZnS based material.

In some embodiments, the first photoelectric conversion component is made of a material selected from the group consisting of Si, GaAs, InP, GaInP, $CuInGaSe_2$, $CuInSe_2$, CdS, CdTe, dye sensitizing material, polymer material and quantum dot material.

In some embodiments, the thermoelectric conversion component is made of a material selected from the group consisting of $Bi_2Te_3$ based material, $Sb_2Se_3$ based material, $Sb_2Te_3$ based material, BiSb based material, $Zn_4Sb_3$ based material, $Mg_3Sb_2$ based material and $Sb_2Se_3$ based material.

In some embodiments, the radio-voltaic component is made of a material selected from the group consisting of Ge, Si, InP, GaAs, GaP, SiC, $TiO_2$ nanotube array, ZnO, GaN, ZnS, SiCN, SiCN/Si, diamond and AlN. The radioluminescence component is made of a material selected from the group consisting of ZnS:Cu, ZnS:Ag, $SrAl_2O_4$:Eu$^{2+}$, $SrAl_2O_4$:Dy$^{2+}$ and $Y_2O_2$S:Eu.

With the combination of triboluminescence material, thermoelectric material, radio-voltaic material and radioluminescence material, the triboluminescence isotope battery provided in the present disclosure can break through the technologic bottleneck of single energy conversion and large energy loss existing in the traditional static isotope battery, thus significantly improving the energy conversion efficiency, with features of high energy conversion efficiency, high output power, strong environmental applicability, excellent working stability, long service life, easy to perform and the like, thereby ensuring stable working in the fields such as military defense, deep space and deep sea, polar region exploration, biomedicine, electronics industry and the like for a long time, and meeting the requirements like environmental protection, high efficiency, portability, and universality.

The present disclosure has at least the following advantages compared to the prior art.

First, the present disclosure provides a new isotope battery by combination of triboluminescence material, photoelectric material, thermoelectric material, radio-voltaic material, radioluminescence material and the like to achieve cascading energy conversion, thus significantly improving the energy conversion efficiency and meeting the requirements of low carbon, environmental protection, integration, efficiency, economic and universality.

Second, the isotope battery in the present disclosure is of improved electrical output characteristics and expanded applications in MEMS/NEMS, low/ultra-low-power electronic devices and the like through large-scale micro/nano integration of energy conversion devices.

Third, the isotope battery in the present disclosure can convert radioactive decay energy into electric energy by use of multi-stage energy conversion structures such as cantilever beam, triboluminescence component, radio-voltaic component and radioluminescence component, with excellent shielding to rays, and also can improve safety because of the nano-lead plexiglass composite coated in the inner surface of the housing.

Fourth, the isotope battery in the present disclosure is further provided with gaskets and a buffing component to thermally insulate and fix the connector between the electrodes and energy conversion devices as well as the outer surface of energy conversion devices, thus relieving the mechanical squeeze and thermal stress present in the inner elements such as the radioactive source, the energy conversion devices and the like, with improved stability, stronger applicability in extreme environments.

DETAILED DESCRIPTION

Figure 1:
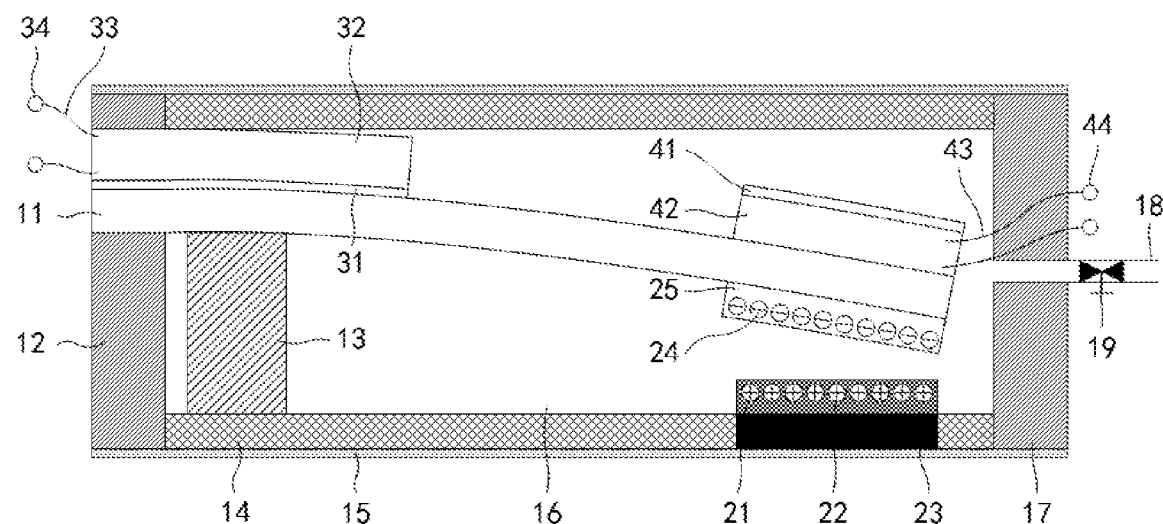
FIG. 1 is a schematic diagram showing the structure of a triboluminescence isotope battery according to one embodiment of the present disclosure.

Reference will be made in detail to examples of the present disclosure. It would be appreciated by those skilled in the art that the following examples are explanatory and cannot be construed to limit the scope of the present disclosure. The specific techniques or conditions not indicated in the examples are performed according to the techniques or conditions described in the literature in the prior art or according to the product instructions. In addition, the reagents or instruments used not indicated with manufacturer are all common products commercially available.

In one aspect, the present disclosure in embodiments provides an isotope battery. According to some embodiments of the present disclosure, the triboluminescence isotope battery includes a housing defining a chamber; and one or more energy conversion devices disposed in the chamber. The energy conversion device includes: a holder, disposed at the housing and in the chamber; a cantilever beam, having a first end region fixed at the holder, and a second end region movable in the chamber; a triboluminescence component, disposed at an upper surface of the first end region of the cantilever beam; a first photoelectric conversion component, disposed at an upper surface of the triboluminescence component; a radioactive source, disposed in the chamber and configured to emit a first charge and a second charge which have opposite polarity; a first charge collecting component, configured to enrich the first charge and disposed at a lower surface of the second end region of the cantilever beam; a second charge collecting component, configured to enrich the second charge and allow the second charge enriched thereby to attract the first charge enriched by the first charge collecting component such that the second end region of the cantilever beam moves toward the second charge collecting component; a first thermoelectric conversion component, disposed at an upper surface of the second end region of the cantilever beam; and a heat dissipation component, disposed at a surface of the first thermoelectric conversion component. Therefore, the isotope battery can break through the technologic bottleneck of single energy conversion and large energy loss existing in the traditional isotope batteries, with features of high energy conversion efficiency, excellent working stability and high micro/nano integration.

According to the isotope battery of the present disclosure, the radioactive source (also called as radioisotope) emits decayed rays into energy conversion devices (such as, a charge enrichment component, a photoelectric conversion component and a thermoelectric conversion component) which can convert decay energy of radioactive source into electric energy. Specifically, the conversion process for electrical output of the isotope battery is as follows. The radioactive source emits a first charge and a second charge which have opposite polarity. The first charge collecting component disposed at the lower surface of the second end region of the cantilever beam enriches the first charge, and the second charge collecting component enriches the second charge and allows the second charge enriched thereby to attract the first charge enriched by the first charge collecting component such that the second end region of the cantilever beam moves toward the second charge collecting component under the Coulomb force. The triboluminescence component generates a mechanical deformation with the movement of the cantilever beam, and thus emitting specific spectrum which will be converted into electrical output via the first photoelectric conversion component disposed at the upper surface of the triboluminescence component. However, when the first charge collecting component contacts with the second charge collecting component, the coulomb force disappears, and then the first and second charge collecting components separate (i.e. forming a cycle). Thus, the electrical output is generated by such reciprocating cycles. Further, the first thermoelectric conversion component converts the thermal difference between the cantilever beam and the external temperature of the heat dissipation component into electrical output.

According to some embodiments, the specific structure, shape and the like of the housing can be flexibly selected according to actual needs. In some embodiments, the housing is shaped as a cylindrical shape and is further provided with a first gasket and a second gasket at two ends respectively, such that a sealed chamber is formed in the housing. For the energy conversion device adjacent to the first gasket, the first end region of the cantilever beam extends to and is embedded in the first gasket. The second gasket is provided with a nozzle controlled by a valve, such that the sealed chamber can communicate with the outside by the nozzle. In some embodiments, the housing is made of aluminum silicate. The first gasket and the second gasket can be made of same materials provided the materials have mechanical strength, heat insulation effect and radiation shielding effect for the housing, such as carbon fiber, rubber and the like. The first and second gaskets are useful in buffing the mechanical stress and thermal stress existing in the housing, thus improving the work stability and environmental adaptability for the triboluminescence isotope battery. The nozzle has an opening in a shape of round hole, and the valve can be a ball valve, thereby allowing the generation of a vacuum environment in the sealed chamber.

According to some embodiments, the inner surface of the housing is further provided with a buffing component. In some embodiments, the buffing component can be made of a graphite-epoxy thermally conductive composite (GEC), thereby thermally insulating and fixing the connector between the electrodes and energy conversion devices as well as the outer surface of energy conversion devices, but also buffing the mechanical stress and thermal stress existing in the housing, with improved stability and environmental adaptability in extreme environments. In some embodiments, the buffing component can be disposed between the first gasket and the second gasket. The components disposed at the housing (such as the radioactive source, the energy conversion device, the second charge collecting component and the like) can be disposed on the buffing component or disposed through the buffing component and on the surface of the housing.

According to some embodiments, the inner surface of the housing can be coated with a nano-lead plexiglass composite to improve the radiation shielding effect and safety of the triboluminescence isotope battery. The thickness of the nano-lead plexiglass composite can be flexibly adjusted as the requirements of actual working environment. Thus, the triboluminescence isotope battery of the present disclosure exhibits favorable radiation shielding effect and safety.

According to some embodiments, the specific structure, material, shape and the like of the cantilever beam can be flexibly selected as the actual needs. In some embodiments, the cantilever beam can be made of a material such as Si, Au or Cu, with a wide source and low cost, good mechanical property and fatigue resistance. Thus, the prepared triboluminescence isotope battery displays good stability and long service life.

According to some embodiments, the first charge collecting component and the second charge collecting component can be a metal film layer which is made of a metal selected from Au, Pd, Pt, Al, Cu, Ni and Ti. In some embodiments, the radioactive source and the second charge collecting component are integrated as a single component, that is the single component exhibits the function of both the radioactive source and the second charge collecting component.

According to some embodiments, a large range of radioactive sources can be selected for the triboluminescence isotope battery of the present disclosure. The radioactive source includes at least one of an alpha radioactive source and a beta radioactive source. In some specific embodiments, the alpha radioactive source is at least one selected from the group consisting of $^{210}$Po, Gd$^{210}$Po, Y$^{210}$Po, La$^{210}$Po, Ce$^{210}$Po, Pr$^{210}$Po, Nd$^{210}$Po, Sm$^{210}$Po, Eu$^{210}$Po, Tb$^{210}$Po, Dy$^{210}$Po, Ho$^{210}$Po, Er$^{210}$Po, Tm$^{210}$Po, Yb$^{210}$Po, Lu$^{210}$Po, Pm$^{210}$Po, Sc$^{210}$Po, Gd$_3^{210}$Po, Y$_3^{210}$Po, La$_3^{210}$Po, Ce$_3^{210}$Po, Pr$_3^{210}$Po, Nd$_3^{210}$Po, Sm$_3^{210}$Po, Eu$_3^{210}$Po, Tb$_3^{210}$Po, Dy$_3^{210}$Po, Ho$_3^{210}$Po, Er$_3^{210}$Po, Tm$_3^{210}$Po, Yb$_3^{210}$Po, Lu$_3^{210}$Po, $^{228}$Th, $^{228}$ThO$_2$, $^{235}$U, $^{238}$Pu, $^{238}$PuO$_2$ microsphere, $^{238}$PuO$_2$—Mo ceramic, $^{238}$PuO$_2$ fuel ball, $^{238}$PuO$_2$ ceramic, $^{238}$Pu—Zr alloy, $^{238}$Pu—Ga alloy, $^{238}$Pu—Pt alloy, $^{238}$Pu—Sc alloy, $^{238}$PuN, $^{238}$PuC, $^{241}$Am, $^{242}$Cm, $^{242}$Cm$_2$O$_3$, $^{244}$Cm and $^{244}$Cm$_2$O$_3$. The beta radioactive source is at least one selected from the group consisting of $(C_4H_3^3H_5-)_n$, Sc$^3$H$_2$, $^{14}$C, $^{35}$S, $^{63}$Ni, $^{90}$Sr, $^{90}$Sr/$^{90}$Y, $^{90}$SrTiO$_3$, $^{90}$SrNO$_3$, $^{90}$SrNO$_3$/dicyclohexano-18-crownether-6, $^{106}$Ru, $^{137}$Cs, $^{137}$CsCl, $^{144}$Ce, $^{144}$CeO$_2$, $^{147}$Pm, $^{147}$Pm$_2$O$_3$ and $^{151}$Sm.

It should be noted, when the radioactive source is represented in $(C_4H_3^3H_5-)_n$, the radioactive source is tritiated poly(l-ethylethylene), where n represents the polymerization degree, without limitation for specific values. The polymerization degree of the radioactive source can be flexibly selected by those skilled in the art according to application fields or specific parameters of the triboluminescence isotope battery.

According to some embodiments, the radioactive source can be a radioisotope film. Its activity, size and the like can be controlled according to the requirements of output voltage and current in actual application.

According to some embodiments, the radioactive source can be flexibly set at a specific position as per actual conditions provided that it can radiate energy which will be converted into electrical energy output. In the embodiments, the radioactive source can be arranged in two ways. In a first way, the radioactive source and the first charge collection component are disposed correspondingly, where the first charge collecting component is configured to enrich charges by directly absorbing the particles radiated by the radioactive source, and the second charge collecting component is configured to contact with the radioactive source directly, for example, the radioactive source is disposed at a surface of the second charge collecting component away from the housing. In a second way, the radioactive source and the first charge collection component are not correspondingly disposed, and the first charge collection component and the second charge collecting component are respectively connected to energy conversion components to enrich electric charges, for example, the radioactive source is clamped in a cavity defined by the hollow structure of the holder, the upper surface of the radioactive source is disposed with a second energy conversion component which is electrically connected to the first charge collecting component, and the lower surface of the radioactive source is disposed with a third energy conversion component which is electrically connected to the second charge collecting component.

According to some embodiments, the triboluminescence isotope battery further comprises a first energy conversion component when the radioactive source is disposed in the first way. The first energy conversion component is disposed at the side of the radioactive source away from the first charge collection component. Therefore, the first energy conversion component can absorb the energy radiated from the side of the radioactive source close to the housing and convert the energy into electric energy output, thereby effectively improving the energy conversion efficiency. Use of a variety of energy conversion methods can overcome the problems of single energy conversion and large energy loss.

According to some embodiments, the first energy conversion component is any one of a second thermoelectric conversion component, a first radio-voltaic component and a first radioluminescence component. Therefore, use of a variety of energy conversion methods can overcome the problems of single energy conversion and large energy loss, with improved energy conversion efficiency to a large extent, and meeting the requirements of low carbon, environmental protection, integration efficiency, economic and universality.

According to some embodiments, the second and third energy conversion components each are any one of a third thermoelectric conversion component, a second radio-voltaic component and a second radioluminescence component when the radioactive source is disposed in the second way. Therefore, use of a variety of energy conversion methods can overcome the problems of single energy conversion and large energy loss, with improved energy conversion efficiency to a large extent, and meeting the requirements of low carbon, environmental protection, integration efficiency, economic and universality.

The thermoelectric conversion components in the present disclosure (such as the first thermoelectric conversion component, the second thermoelectric conversion component, the third thermoelectric conversion component and the like) are components that can convert heat into electrical energy via thermoelectric conversion. The thermoelectric conversion component is made of one or more materials selected from the group consisting of $Bi_2Te_3$ based material, $Sb_2Se_3$ based material, $Sb_2Te_3$ based material, BiSb based material, $Zn_4Sb_3$ based material, $Mg_3Sb_2$ based material and $Sb_2Se_3$ based material.

The radio-voltaic components in the present disclosure (such as the first radio-voltaic component, the second radio-voltaic component and the like) are components that can convert the energy radiated by the radioactive source into electrical energy based on the radiation volt effect. The radio-voltaic component is made of one or more materials selected from the group consisting of Ge, Si, InP, GaAs, GaP, SiC, $TiO_2$ nanotube array (TNTA), ZnO, GaN, ZnS, SiCN, SiCN/Si, diamond and AlN.

The radioluminescence component in the present disclosure (such as the first radioluminescence component, the second radioluminescence component and the like) usually comprises a radioluminescence material and a photoelectric conversion component. The radioluminescence material absorbs energy radiated by the radioactive source, thus emitting lights. The photoelectric conversion component converts lights into electrical energy output. The useful radioluminescence material is selected from the group consisting of ZnS:Cu, ZnS:Ag, $SrAl_2O_4$:$Eu^{2+}$, $SrAl_2O_4$:$Dy^{2+}$ and $Y_2O_2S$:Eu. The photoelectric components (such as a first photoelectric conversion component, and the photoelectric conversion component in the radioluminescence component) is made of a material selected from the group consisting of Si, GaAs, InP, GaInP, $CuInGaSe_2$, $CuInSe_2$, CdS, CdTe, dye sensitizing material, polymer material and quantum dot material.

The triboluminescence components in the present disclosure are components that can emit lights by friction or force deformation. The triboluminescence component is made of one or more materials selected from the group consisting of sucrose, D-glucose, lactose, maltose, L-rhamnose, tartaric acid, lithium acetate, potassium hydrogen malonate, vitamin C, sorbitol hexaacetate, phthalic acid, coumarin, acenaphthene, 9-anthracenemethanol based material, polybutadiene, epoxy resin, europium vanadium, copper vanadium, tetrahedral manganese complex, $(NH_4)_2C_2O_4$, $LiSO_4 \cdot H_2O$, $Ce(SO_4)_3 \cdot 8H_2O$, $Zn(NO_3)_2 \cdot 6H_2O$, $(UO_2)(NO_3)_2 \cdot 6H_2O$, SiC, Si, InP, GaAs, Ge, diamond, MgO, CaO, SrO, NaF, LiF, NaCl, KCl, KI, CsI, RbI, KBr, RbBr, $BaAl_2Si_2O_8$ based material, $Sr_3Al_2O_6$ based material, $SrAl_2O_4$ based material, $Ca_2SrMgSi_2O_7$ based material, $Ca_2MgSi_2O_7$ based material, $SrMgAl_{10}O_{17}$ based material, $Sr_2Mg_2(PO_4)_2$ based material, BaFCl based material, BaFBr based material, $K_2Mg_2(SO_4)_3$ based material, $BaSi_2O_2N_2$ based material, $CaO \cdot Nb_2O_5$ based material, $ZnGa_2O_4$ based material, $MgGa_2O_4$ based material, $ZnAl_2O_4$ based material, $LiNbO_3$ based material, $SrAl_2O_4$ based material and ZnS based material. Specifically, the triboluminescence component deforms with the reciprocating motion of the cantilever beam, thus emitting lights. The first photoelectric conversion component, equivalent to the photoelectric conversion component as described above, can convert the emitted lights into electrical energy output.

According to an embodiment, a heat dissipation component can be disposed at a surface of the first thermoelectric conversion component, thereby enlarging the temperature difference between the cantilever beam and the external environment, with improved energy conversion efficiency. In some embodiments, the heat dissipation component may be made of a material of graphite, copper and aluminum alloy, with excellent cooling effect.

It would be understood by skilled in the art that all the thermoelectric conversion components, the photoelectric conversion components, the radio-voltaic components and the radioluminescence components involved in the present disclosure are provided with an output wire and an output terminal connected to the output wire in order to output electric energy effectively. That is, the triboluminescence isotope battery further includes multiple output wires, including: a first output wire of the first photoelectric conversion component, electrically connected to the first photoelectric conversion component; a second output wire of the first thermoelectric conversion component, electrically connected to the first thermoelectric conversion component; a third output wire of the second thermoelectric conversion component, electrically connected to the second thermoelectric conversion component; a fourth output wire of the first radio-voltaic component, electrically connected to the first radio-voltaic component; a fifth output wire of the first radioluminescence component, electrically connected to the first radioluminescence component; a sixth output wire of the third thermoelectric conversion component, electrically connected to the third thermoelectric conversion component; a seventh output wire of the second radio-voltaic component, electrically connected to the second radio-voltaic component; and an eighth output wire of the second radioluminescence component, electrically connected to the second radioluminescence component. The plurality of output wires can be nickel-plated copper core high refractory insulated wires. The output terminal can be a clamped terminal and is made of a material such as Al or Cu.

Referring to the drawings, the triboluminescence isotope battery of the present disclosure is described as below.

In one embodiment of the present disclosure, referring to FIG. 1 to FIG. 5, the triboluminescence isotope battery is illustrated as below. The triboluminescence isotope battery formed as a cylindrical structure, includes a housing 15, defining a chamber 16; and an energy conversion device disposed in the chamber 16. The energy conversion device includes a holder 13, a cantilever beam 11, a triboluminescence component 31, a first photoelectric conversion component 32, a radioactive source 21, a first charge collecting component 25, a second charge collecting component 23, a first thermoelectric conversion component 42 and a heat dissipation component 41. Specifically, the housing 15 is further provided with a first gasket 12 and a second gasket 17 at two ends respectively. The cantilever beam 11 has a first end region fixed at the holder 13, and a second end region movable in the chamber 16, in which the first end region of the cantilever beam 11 extends to and is embedded in the first gasket 12 or is fixed at the housing 15. The triboluminescence component 31 is disposed at an upper surface of the first end region of the cantilever beam 11. The first photoelectric conversion component 32 is disposed at an upper surface of the triboluminescence component 31, and further provided with a first output terminal 34 which is electrically connected to the first photoelectric conversion component 32 via a first output wire 33 to output electric energy converted from lights. The radioactive source 21 is disposed in the chamber 16 and configured to emit a first charge (such as a negative charge 24) and a second charge with an opposite polarity to the first charge (such as a positive charge 22). According to this embodiment, the radioactive source 21 is a radioisotope film and disposed on the surface of the second charge collecting component 23. The first charge collecting component 25 is configured to enrich the first charge and disposed at a lower surface of the second end region of the cantilever beam 11. The second charge collecting component 23 is configured to enrich the second charge and allow the second charge enriched thereby to attract the first charge enriched by the first charge collecting component 25 such that the second end region of the cantilever beam 11 moves toward the second charge collecting component 23 by the Coulomb force. When the first charge collecting component 25 contacts with the second charge collecting component 23, the coulomb force disappears, and then the first and second charge collecting components separate (i.e. forming a cycle). Thus, the electrical output is generated by such reciprocating cycles. According to this embodiment, the second charge collecting component 23 is disposed at the housing 15 and corresponds to the first charge collecting component 25. The first thermoelectric conversion component 42 is disposed at an upper surface of the second end region of the cantilever beam 11, and a heat dissipation component 41 is disposed at a surface of the first thermoelectric conversion component 42. The first thermoelectric conversion component 42 is further provided with a second output terminal 44 which is electrically connected to the first thermoelectric conversion component 42 via a second output wire 43 to output electric energy converted from the thermal difference between the first thermoelectric conversion component 42 and the external temperature of the heat dissipation component 41. The holder 13 is arranged between a lower surface of the first end region of the cantilever beam 11 and the housing 15. A buffing component 14 is further disposed on the inner surface of the housing 15 tightly, particularly disposed between the first gasket 12 and the second gasket 17. The second gasket 17 is provided with a nozzle 18 controlled by a valve 19 to allow the formation of a vacuous chamber. The nozzle 18 can be disposed at a center of the second gasket 17.

Figure 2:
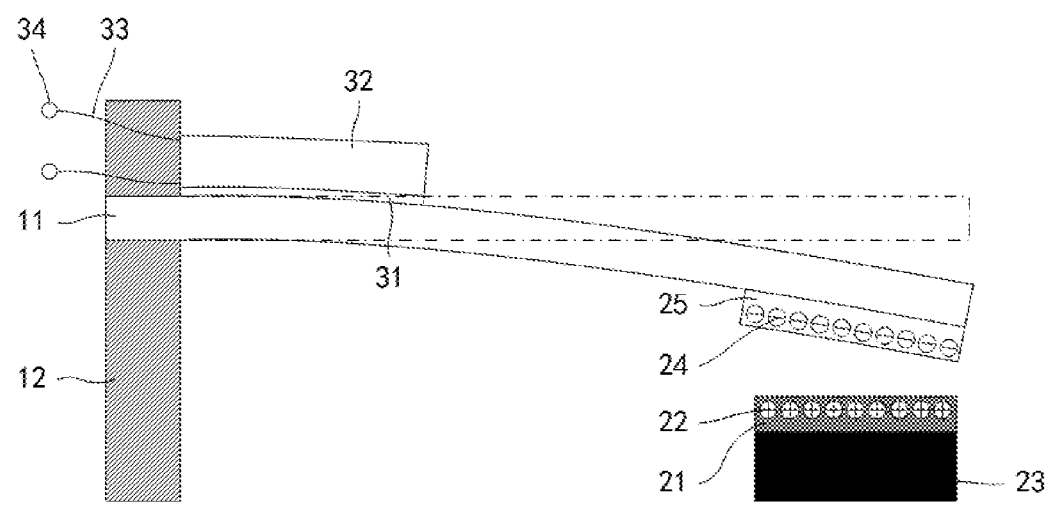
FIG. 2 is a schematic diagram showing the operation process of a triboluminescence isotope battery according to another embodiment of the present disclosure.

With combination to FIG. 2, the triboluminescence isotope battery of the present disclosure realizes the electrical output as below. The radioactive source 21 emits a first charge and a second charge which have opposite polarity. The first charge collecting component 25 disposed at the lower surface of the second end region of the cantilever beam 11 enriches the first charge, and the second charge collecting component 23 enriches the second charge and allows the second charge enriched thereby to attract the first charge enriched by the first charge collecting component 25 such that the second end region of the cantilever beam 11 moves toward the second charge collecting component 23 under the Coulomb force. The triboluminescence component 31 generates a mechanical deformation with the movement of the cantilever beam 11, and thus emitting specific spectrum which can be converted into electrical output via the first photoelectric conversion component 32 disposed at the upper surface of the triboluminescence component 31. However, when the first charge collecting component 25 contacts with the second charge collecting component 23, the coulomb force disappears, and then the first and second charge collecting components separate (i.e. forming a cycle). Thus, the electrical output is generated by such reciprocating cycles. Further, the first thermoelectric conversion component 42 converts the thermal difference between the cantilever beam 11 and the external temperature of the heat dissipation component 41 into electrical output.

Figure 3:
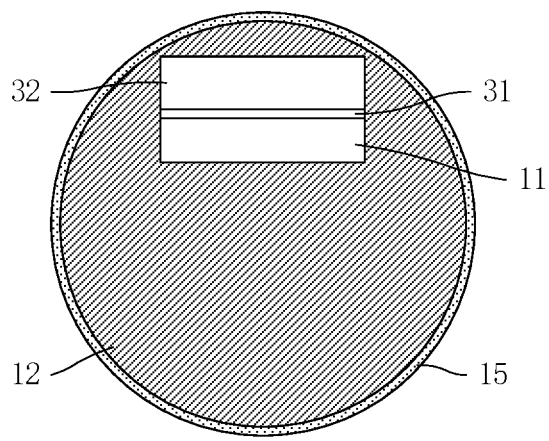
FIG. 3 is a left view showing the structure of a triboluminescence isotope battery with a single cantilever beam according to a further embodiment of the present disclosure.
Figure 4:
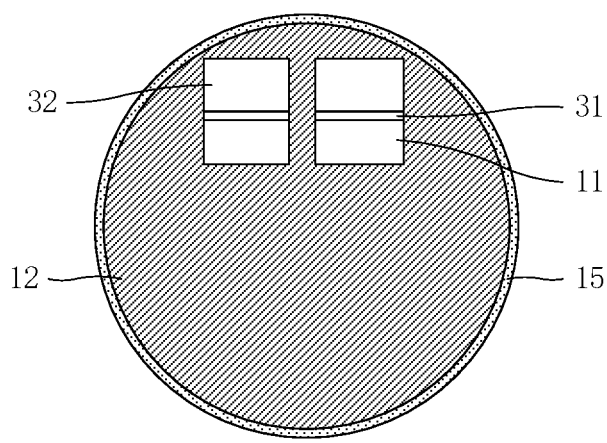
FIG. 4 is a left view showing the structure of a triboluminescence isotope battery with double cantilever beams according to a further embodiment of the present disclosure.

FIG. 3 and FIG. 4 are left-view graphs of the triboluminescence isotope battery of FIG. 1, in which the end surface of the first gasket 12 is embedded in the housing 15, and the triboluminescence component 31 and the first photoelectric conversion component 32 fixed at the first end region of the cantilever beam 11 are respectively embedded in the first gasket 12. FIG. 3 is a left-view graph of a triboluminescence isotope battery with a single cantilever beam. FIG. 4 is a left-view graph of a triboluminescence isotope battery with two cantilever beams.

Figure 5:
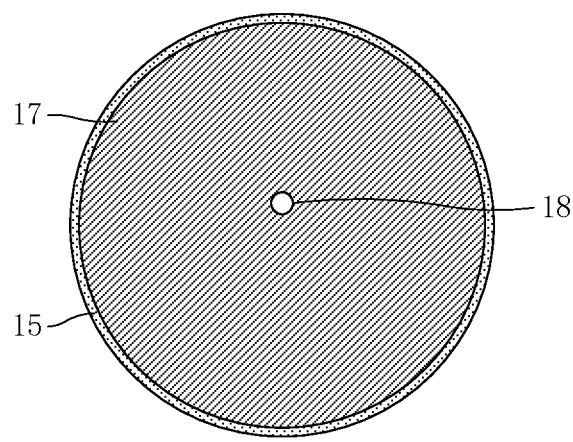
FIG. 5 is a right view showing the structure of a triboluminescence isotope battery according to a further embodiment of the present disclosure.

FIG. 5 is a right-view graph of the triboluminescence isotope battery of FIG. 1, in which the nozzle 18 is clamped in the second gasket 17.

Figure 6:
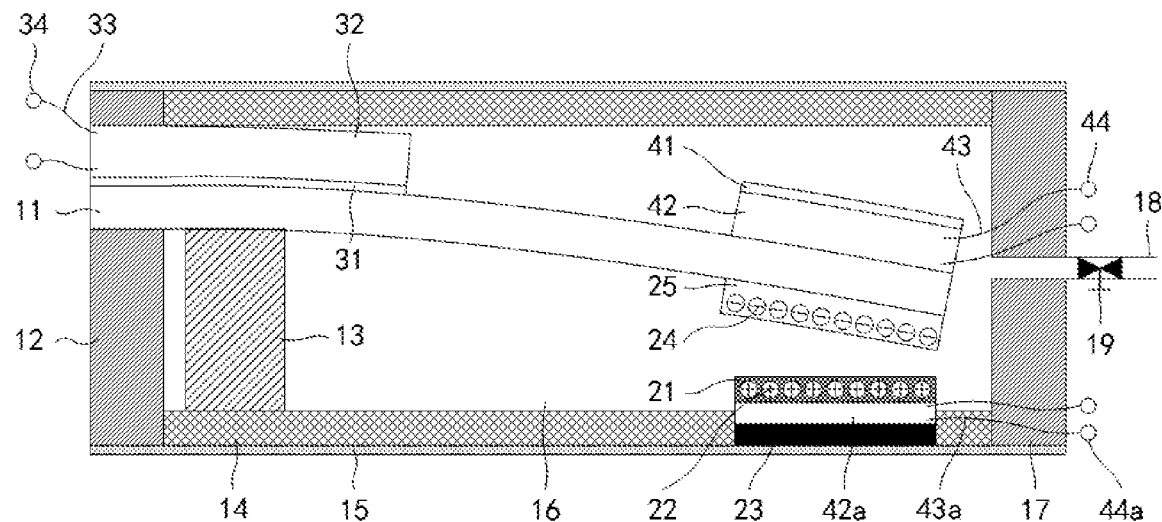
FIG. 6 is a schematic diagram showing the structure of a triboluminescence isotope battery according to a further embodiment of the present disclosure.

In another embodiment of the present disclosure, referring to FIG. 6, the triboluminescence isotope battery is illustrated as below. The triboluminescence isotope battery formed as a cylindrical structure, includes a housing 15, defining a chamber 16; and an energy conversion device disposed in the chamber 16. The energy conversion device includes a holder 13, a cantilever beam 11, a triboluminescence component 31, a first photoelectric conversion component 32, a radioactive source 21, a first charge collecting component 25, a second charge collecting component 23, a first thermoelectric conversion component 42 and a heat dissipation component 41. Specifically, the housing 15 is further provided with a first gasket 12 and a second gasket 17 at two ends respectively. The cantilever beam 11 has a first end region fixed at the holder 13, and a second end region movable in the chamber 16, in which the first end region of the cantilever beam 11 extends to and is embedded in the first gasket 12 or is fixed at the housing 15. The triboluminescence component 31 is disposed at an upper surface of the first end region of the cantilever beam 11. The first photoelectric conversion component 32 is disposed at an upper surface of the triboluminescence component 31, and further provided with a first output terminal 34 which is electrically connected to the first photoelectric conversion component 32 via a first output wire 33 to output electric energy converted from lights. The radioactive source 21 is disposed in the chamber 16 and configured to emit a first charge (such as a negative charge 24) and a second charge with an opposite polarity to the first charge (such as a positive charge 22). According to this embodiment, the radioactive source 21 is a radioisotope film. The first charge collecting component 25 is configured to enrich the first charge emitted by the radioactive source 21 and disposed at a lower surface of the second end region of the cantilever beam 11. The second charge collecting component 23 is configured to enrich the second charge emitted by the radioactive source 21 and allow the second charge enriched thereby to attract the first charge enriched by the first charge collecting component 25 such that the second end region of the cantilever beam 11 moves toward the second charge collecting component 23 by the coulomb force. When the first charge collecting component 25 contacts with the second charge collecting component 23, the coulomb force disappears, and then the first and second charge collecting components separate (i.e. forming a cycle). Thus, the electrical output is generated by such reciprocating cycles. According to this embodiment, the second charge collecting component 23 is disposed at the housing and includes a first surface close to the first charge collecting component 25 and a second surface away from the first charge collecting component 25. The radioactive source 21 is disposed at the first surface of the second charge collecting component 23. The triboluminescence isotope battery further includes a first energy conversion component, disposed between the radioactive source 21 and the second charge collecting component 23. According to this embodiment, the first energy conversion component is a second thermoelectric conversion component 42a, which is further provided with a third output terminal 44a electrically connected to the second thermoelectric conversion component 42a via a third output wire 43a. Thus, the second thermoelectric conversion component 42a can absorb heat radiated from the side of the radioactive source 21 close to the housing 15 and convert the heat into an electrical output, thereby effectively improving the energy conversion efficiency and overcoming the deficiency of single transduction and large energy loss. The first thermoelectric conversion component 42 is disposed at an upper surface of the second end region of the cantilever beam 11, and a heat dissipation component 41 is disposed at a surface of the first thermoelectric conversion component 42. The first thermoelectric conversion component 42 is further provided with a second output terminal 44 which is electrically connected to the first thermoelectric conversion component 42 via a second output wire 43 to output electric energy converted from the thermal difference between the first thermoelectric conversion component 42 and the external temperature of the heat dissipation component 41. The holder 13 is arranged between a lower surface of the first end region of the cantilever beam 11 and the housing 15. A buffing component 14 is further disposed on the inner surface of the housing 15 tightly, particularly disposed between the first gasket 12 and the second gasket 17. The second gasket 17 is provided with a nozzle 18 controlled by a valve 19 to allow the formation of a vacuous chamber 16. The nozzle 18 can be disposed at a center of the second gasket 17.

Figure 7:
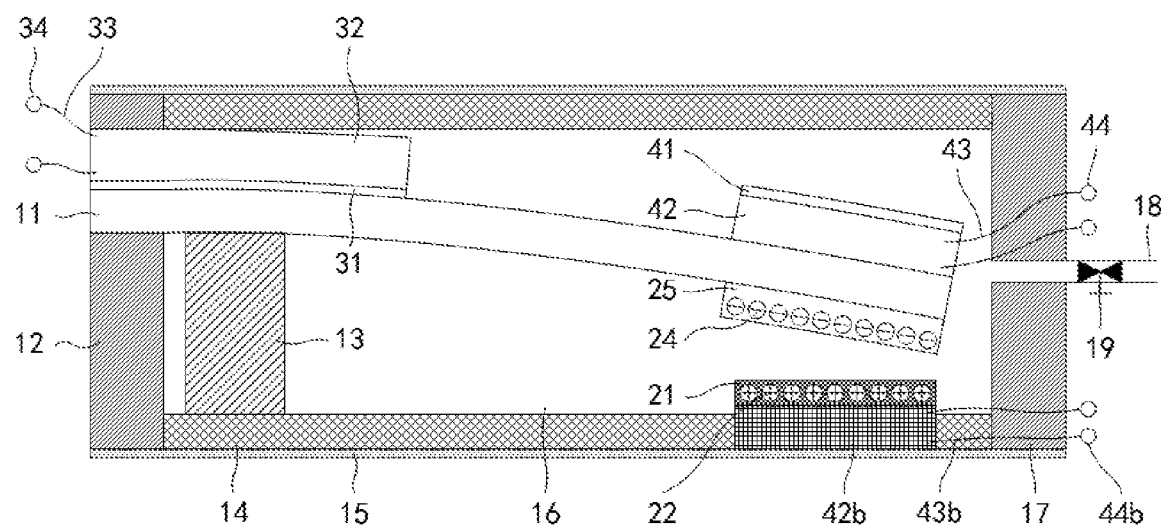
FIG. 7 is a schematic diagram showing the structure of a triboluminescence isotope battery according to a further embodiment of the present disclosure.

In another embodiment of the present disclosure, referring to FIG. 7, the triboluminescence isotope battery is illustrated as below. The triboluminescence isotope battery formed as a cylindrical structure, includes a housing 15, defining a chamber 16; and an energy conversion device disposed in the chamber 16. The energy conversion device includes a holder 13, a cantilever beam 11, a triboluminescence component 31, a first photoelectric conversion component 32, a radioactive source 21, a first charge collecting component 25, a first thermoelectric conversion component 42 and a heat dissipation component 41. Specifically, the housing 15 is further provided with a first gasket 12 and a second gasket 17 at two ends respectively. The cantilever beam 11 has a first end region fixed at the holder 13, and a second end region movable in the chamber 16, in which the first end region of the cantilever beam 11 extends to and is embedded in the first gasket 12 or is fixed at the housing 15. The triboluminescence component 31 is disposed at an upper surface of the first end region of the cantilever beam 11. The first photoelectric conversion component 32 is disposed at an upper surface of the triboluminescence component 31, and further provided with a first output terminal 34 which is electrically connected to the first photoelectric conversion component 32 via a first output wire 33 to output electric energy converted from lights. The radioactive source 21 is disposed in the chamber 16 and configured to emit a first charge (such as a negative charge 24) and a second charge with an opposite polarity to the first charge (such as a positive charge 22). According to this embodiment, the radioactive source 21 is also configured as a second charge collecting component, that is the radioactive source and the second charge collecting component are integrated as a single component (equivalent to the radioactive source 21). The triboluminescence isotope battery further comprises a first energy conversion component, where the first energy conversion component is a first radio-voltaic component 42b and is disposed between the single component and the housing 15. The first radio-voltaic component 42b is further provided with a fourth output terminal 44b electrically connected to the first radio-voltaic component 42b via a fourth output wire 43b. Thus, the first radio-voltaic component 42b can absorb the particles radiated from the side of the radioactive source 21 close to the housing 15 and convert the radiation energy into electrical output, thereby effectively improving the energy conversion efficiency and overcoming the deficiency of single transduction and large energy loss. The first charge collecting component 25 is configured to enrich the first charge 24 emitted by the radioactive source 21 and disposed at a lower surface of the second end region of the cantilever beam 11. The single component 21 is also configured to enrich the second charge 22 emitted per se and allow the second charge enriched thereby to attract the first charge enriched by the first charge collecting component 25 such that the second end region of the cantilever beam 11 moves toward the single component 21 by the coulomb force. When the first charge collecting component 25 contacts with the single component 21, the coulomb force disappears, and then the first charge collecting component 25 and the single component 21 separate (i.e. forming a cycle). Thus, the electrical output is generated by such reciprocating cycles. The first thermoelectric conversion component 42 is disposed at an upper surface of the second end region of the cantilever beam 11, and a heat dissipation component 41 is disposed at a surface of the first thermoelectric conversion component 42. The first thermoelectric conversion component 42 is further provided with a second output terminal 44 which is electrically connected to the first thermoelectric conversion component 42 via a second output wire 43 to output electric energy converted from the thermal difference between the first thermoelectric conversion component 42 and the external temperature of the heat dissipation component 41. The holder 13 is arranged between a lower surface of the first end region of the cantilever beam 11 and the housing 15. A buffing component 14 is further disposed on the inner surface of the housing 15 tightly, particularly disposed between the first gasket 12 and the second gasket 17. The second gasket 17 is provided with a nozzle 18 controlled by a valve 19 to allow the formation of a vacuous chamber 16. The nozzle 18 can be disposed at a center of the second gasket 17.

Figure 8:
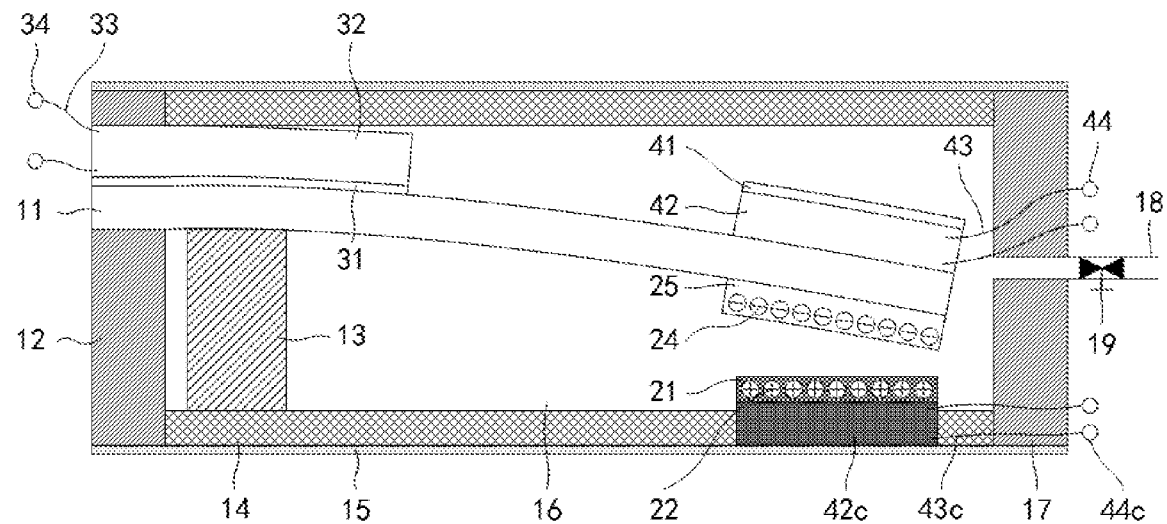
FIG. 8 is a schematic diagram showing the structure of a triboluminescence isotope battery according to a further embodiment of the present disclosure.

In another embodiment of the present disclosure, referring to FIG. 8, the triboluminescence isotope battery is illustrated as below. The triboluminescence isotope battery formed as a cylindrical structure, includes a housing 15, defining a chamber 16; and an energy conversion device disposed in the chamber 16. The energy conversion device includes a holder 13, a cantilever beam 11, a triboluminescence component 31, a first photoelectric conversion component 32, a radioactive source 21, a first charge collecting component 25, a first thermoelectric conversion component 42 and a heat dissipation component 41. Specifically, the housing 15 is further provided with a first gasket 12 and a second gasket 17 at two ends respectively. The cantilever beam 11 has a first end region fixed at the holder 13, and a second end region movable in the chamber 16, in which the first end region of the cantilever beam 11 extends to and is embedded in the first gasket 12 or is fixed at the housing 15. The triboluminescence component 31 is disposed at an upper surface of the first end region of the cantilever beam 11. The first photoelectric conversion component 32 is disposed at an upper surface of the triboluminescence component 31, and further provided with a first output terminal 34 which is electrically connected to the first photoelectric conversion component 32 via a first output wire 33 to output electric energy converted from lights. The radioactive source 21 is disposed in the chamber 16 and configured to emit a first charge (such as a negative charge 24) and a second charge with an opposite polarity to the first charge (such as a positive charge 22). According to this embodiment, the radioactive source 21 is also configured as a second charge collecting component, that is the radioactive source and the second charge collecting component are integrated as a single component (equivalent to the radioactive source 21). The triboluminescence isotope battery further comprises a first energy conversion component, where the first energy conversion component is a first radioluminescence component 42c and is disposed between the single component 21 and the housing 15. The first radioluminescence component 42c is further provided with a fifth output terminal 44c electrically connected to the first radioluminescence component 42c via a fifth output wire 43c. Thus, the first radioluminescence component 42c can absorb the particles radiated from the side of the radioactive source 21 close to the housing 15 and convert the radiation energy into electrical output, thereby effectively improving the energy conversion efficiency and overcoming the deficiency of single transduction and large energy loss. The first charge collecting component 25 is configured to enrich the first charge 24 emitted by the radioactive source 21 and disposed at a lower surface of the second end region of the cantilever beam 11. The single component 21 is also configured to enrich the second charge 22 emitted per se and allow the second charge enriched thereby to attract the first charge enriched by the first charge collecting component 25 such that the second end region of the cantilever beam 11 moves toward the single component 21 by the coulomb force. When the first charge collecting component 25 contacts with the single component, the coulomb force disappears, and then the first charge collecting component 25 and the single component 21 separate (i.e. forming a cycle). Thus, the electrical output is generated by such reciprocating cycles. The first thermoelectric conversion component 42 is disposed at an upper surface of the second end region of the cantilever beam 11, and a heat dissipation component 41 is disposed at a surface of the first thermoelectric conversion component 42. The first thermoelectric conversion component 42 is further provided with a second output terminal 44 which is electrically connected to the first thermoelectric conversion component 42 via a second output wire 43 to output electric energy converted from the thermal difference between the first thermoelectric conversion component 42 and the external temperature of the heat dissipation component 41. The holder 13 is arranged between a lower surface of the first end region of the cantilever beam 11 and the housing 15. A buffing component 14 is further disposed on the inner surface of the housing 15 tightly, particularly disposed between the first gasket 12 and the second gasket 17. The second gasket 17 is provided with a nozzle 18 controlled by a valve 19 to allow the formation of a vacuous chamber 16. The nozzle 18 can be disposed at a center of the second gasket 17.

Figure 9:
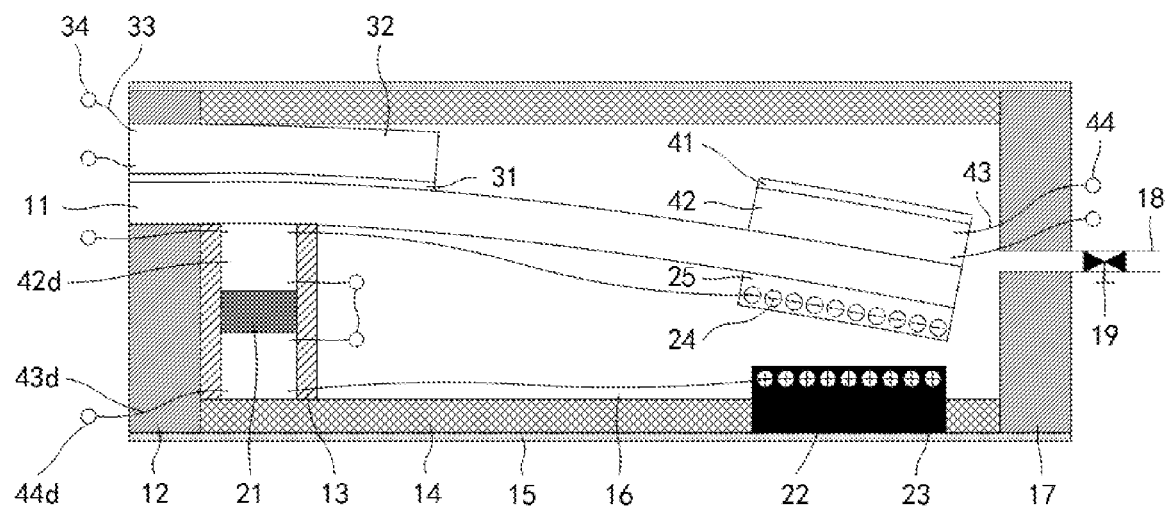
FIG. 9 is a schematic diagram showing the structure of a triboluminescence isotope battery according to a further embodiment of the present disclosure.

In a further embodiment of the present disclosure, referring to FIG. 9, the triboluminescence isotope battery is illustrated as below. The triboluminescence isotope battery formed as a cylindrical structure, includes a housing 15, defining a chamber 16; and an energy conversion device disposed in the chamber 16. The energy conversion device includes a holder 13, a cantilever beam 11, a triboluminescence component 31, a first photoelectric conversion component 32, a radioactive source 21, a first charge collecting component 25, a second charge collecting component 23, a first thermoelectric conversion component 42 and a heat dissipation component 41. Specifically, the housing 15 is further provided with a first gasket 12 and a second gasket 17 at two ends respectively. The cantilever beam 11 has a first end region fixed at the holder 13 and a second end region movable in the chamber 16, in which the first end region of the cantilever beam 11 extends to and is embedded in the first gasket 12 or is fixed at the housing 15. The triboluminescence component 31 is disposed at an upper surface of the first end region of the cantilever beam 11. The first photoelectric conversion component 32 is disposed at an upper surface of the triboluminescence component 31, and further provided with a first output terminal 34 which is electrically connected to the first photoelectric conversion component 32 via a first output wire 33 to output electric energy converted from lights. The holder 13 is arranged between a lower surface of the first end region of the cantilever beam 11 and the housing 15. The radioactive source 21 is disposed in the chamber 16 and configured to emit a first charge (such as a negative charge 24) and a second charge with an opposite polarity to the first charge (such as a positive charge 22). Specifically, according to this embodiment, the holder 13 is formed as a hollow structure which defines a cavity, and the radioactive source 21 is clamped in the cavity. A second energy conversion component is disposed at an upper surface of the radioactive source 21 in the cavity and is electrically connected to the first charge collecting component 25. A third energy conversion component is disposed at a lower surface of the radioactive source 21 in the cavity and is electrically connected to the second charge collecting component 23. The second and third energy conversion components each are a third thermoelectric conversion component 42*d*. The third thermoelectric conversion component 42*d* is further provided with a sixth output terminal 44*d* which is electrically connected to the third thermoelectric conversion component 42*d* via a sixth output wire 43*d*. Thus, the third thermoelectric conversion component 42*d* can absorb the radiated heat as the radioactive source decays and convert the heat into electrical output, thereby effectively improving the energy conversion efficiency and overcoming the deficiency of single transduction and large energy loss. The first charge collecting component 25 is configured to enrich the first charge 24 emitted by the radioactive source 21 and disposed at a lower surface of the second end region of the cantilever beam 11. The second charge collecting component 23 is configured to enrich the second charge 22 emitted by the radioactive source 21 and allow the second charge enriched thereby to attract the first charge enriched by the first charge collecting component 25 such that the second end region of the cantilever beam 11 moves toward the second charge collecting component 23 by the coulomb force. When the first charge collecting component 25 contacts with the second charge collecting component 23, the coulomb force disappears, and then the first and second charge collecting components separate (i.e. forming a cycle). Thus, the electrical output is generated by such reciprocating cycles. According to this embodiment, the second charge collecting component 23 is disposed at the housing 15 and corresponds to the first charge collecting component 25. The first thermoelectric conversion component 42 is disposed at an upper surface of the second end region of the cantilever beam 11, and a heat dissipation component 41 is disposed at a surface of the first thermoelectric conversion component 42. The first thermoelectric conversion component 42 is further provided with a second output terminal 44 which is electrically connected to the first thermoelectric conversion component 42 via a second output wire 43 to output electric energy converted from the thermal difference between the first thermoelectric conversion component 42 and the external temperature of the heat dissipation component 41. A buffing component 14 is further disposed on the inner surface of the housing 15 tightly, particularly disposed between the first gasket 12 and the second gasket 17. The second gasket 17 is provided with a nozzle 18 controlled by a valve 19 to allow the formation of a vacuous chamber. The nozzle 18 can be disposed at a center of the second gasket 17.

Figure 10:
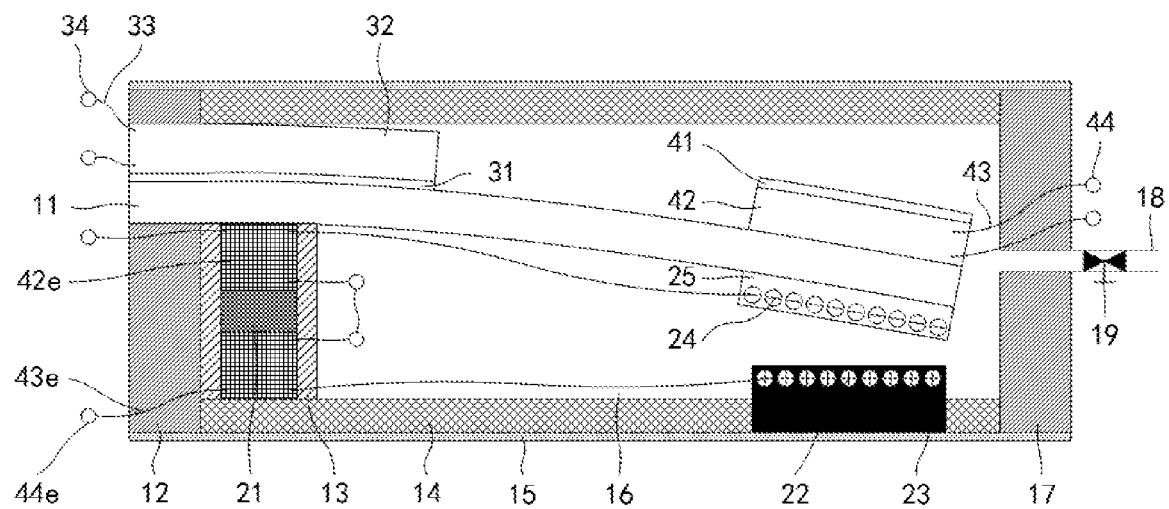
FIG. 10 is a schematic diagram showing the structure of a triboluminescence isotope battery according to a further embodiment of the present disclosure.

In a further embodiment of the present disclosure, referring to FIG. 10, the triboluminescence isotope battery is illustrated as below. The triboluminescence isotope battery formed as a cylindrical structure, includes a housing 15, defining a chamber 16; and an energy conversion device disposed in the chamber 16. The energy conversion device includes a holder 13, a cantilever beam 11, a triboluminescence component 31, a first photoelectric conversion component 32, a radioactive source 21, a first charge collecting component 25, a second charge collecting component 23, a first thermoelectric conversion component 42 and a heat dissipation component 41. Specifically, the housing 15 is further provided with a first gasket 12 and a second gasket 17 at two ends respectively. The cantilever beam 11 has a first end region fixed at the holder 13 and a second end region movable in the chamber 16, in which the first end region of the cantilever beam 11 extends to and is embedded in the first gasket 12 or is fixed at the housing 15. The triboluminescence component 31 is disposed at an upper surface of the first end region of the cantilever beam 11. The first photoelectric conversion component 32 is disposed at an upper surface of the triboluminescence component 31, and further provided with a first output terminal 34 which is electrically connected to the first photoelectric conversion component 32 via a first output wire 33 to output electric energy converted from lights. The holder 13 is arranged between a lower surface of the first end region of the cantilever beam 11 and the housing 15. The radioactive source 21 is disposed in the chamber 16 and configured to emit a first charge (such as a negative charge 24) and a second charge with an opposite polarity to the first charge (such as a positive charge 22). Specifically, according to this embodiment, the holder 13 is formed as a hollow structure which defines a cavity, the radioactive source 21 is clamped in the cavity. A second energy conversion component is disposed at an upper surface of the radioactive source 21 in the cavity and is electrically connected to the first charge collecting component 25. A third energy conversion component is disposed at a lower surface of the radioactive source 21 in the cavity and is electrically connected to the second charge collecting component 23. The second and third energy conversion components each are a second radio-voltaic component 42*e*. The second radio-voltaic component 42*e* is further provided with a seventh output terminal 44*e* which is electrically connected to the second radio-voltaic component 42*e* via a seventh output wire 43*e*. Thus, the second radio-voltaic component 42*e* can absorb radiated particles when the radioactive source decays and convert the radiation energy into electrical output, thereby effectively improving the energy conversion efficiency and overcoming the deficiency of single transduction and large energy loss. The first charge collecting component 25 is configured to enrich the first charge 24 emitted by the radioactive source 21 and disposed at a lower surface of the second end region of the cantilever beam 11. The second charge collecting component 23 is configured to enrich the second charge 22 emitted by the radioactive source 21 and allow the second charge enriched thereby to attract the first charge enriched by the first charge collecting component 25 such that the second end region of the cantilever beam 11 moves toward the second charge collecting component 23 by the coulomb force. When the first charge collecting component 25 contacts with the second charge collecting component 23, the coulomb force disappears, and then the first and second charge collecting components separate (i.e. forming a cycle). Thus, the electrical output is generated by such reciprocating cycles. According to this embodiment, the second charge collecting component 23 is disposed at the housing 15 and corresponds to the first charge collecting component 25. The first thermoelectric conversion component 42 is disposed at an upper surface of the second end region of the cantilever beam 11, and a heat dissipation component 41 is disposed at a surface of the first thermoelectric conversion component 42. The first thermoelectric conversion component 42 is further provided with a second output terminal 44 which is electrically connected to the first thermoelectric conversion component 42 via a second output wire 43, so as to output electric energy converted from the thermal difference between the first thermoelectric conversion component 42 and the external temperature of the heat dissipation component 41. A buffing component 14 is further disposed on the inner surface of the housing 15 tightly, particularly disposed between the first gasket 12 and the second gasket 17. The second gasket 17 is provided with a nozzle 18 controlled by a valve 19 to allow the formation of a vacuous chamber. The nozzle 18 can be disposed at a center of the second gasket 17.

Figure 11:
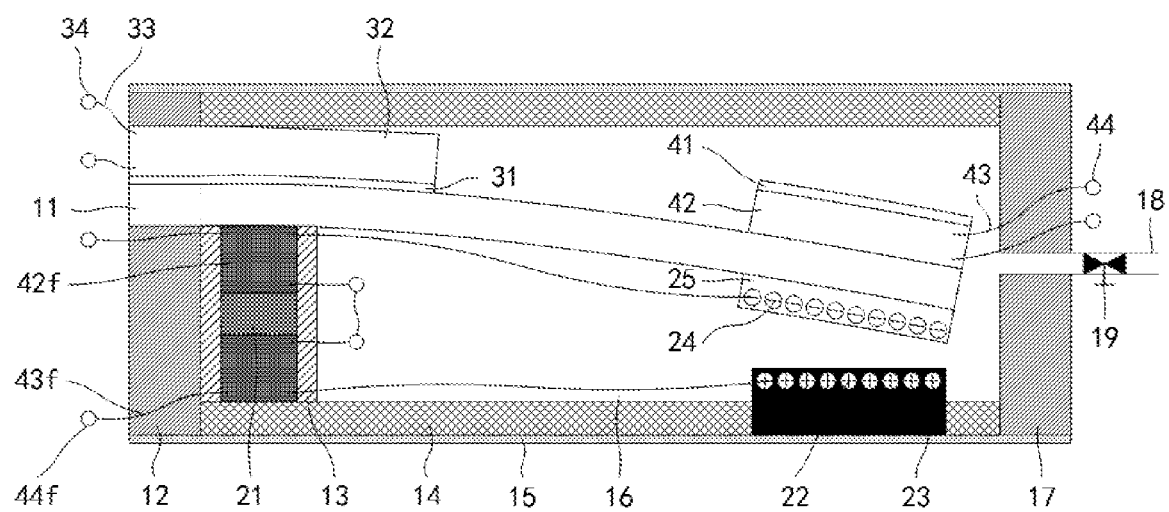
FIG. 11 is a schematic diagram showing the structure of a triboluminescence isotope battery according to a further embodiment of the present disclosure.

In a further embodiment of the present disclosure, referring to FIG. 11, the triboluminescence isotope battery is illustrated as below. The triboluminescence isotope battery formed as a cylindrical structure, includes a housing 15, defining a chamber 16; and an energy conversion device disposed in the chamber 16. The energy conversion device includes a holder 13, a cantilever beam 11, a triboluminescence component 31, a first photoelectric conversion component 32, a radioactive source 21, a first charge collecting component 25, a second charge collecting component 23, a first thermoelectric conversion component 42 and a heat dissipation component 41. Specifically, the housing 15 is further provided with a first gasket 12 and a second gasket 17 at two ends respectively. The cantilever beam 11 has a first end region fixed at the holder 13 and a second end region movable in the chamber 16, in which the first end region of the cantilever beam 11 extends to and is embedded in the first gasket 12 or is fixed at the housing 15. The triboluminescence component 31 is disposed at an upper surface of the first end region of the cantilever beam 11. The first photoelectric conversion component 32 is disposed at an upper surface of the triboluminescence component 31, and further provided with a first output terminal 34 which is electrically connected to the first photoelectric conversion component 32 via a first output wire 33 to output electric energy converted from lights. The holder 13 is arranged between a lower surface of the first end region of the cantilever beam 11 and the housing 15. The radioactive source 21 is disposed in the chamber 16 and configured to emit a first charge (such as a negative charge 24) and a second charge with an opposite polarity to the first charge (such as a positive charge 22). Specifically, according to this embodiment, the holder 13 is formed as a hollow structure which defines a cavity, and the radioactive source 21 is clamped in the cavity. A second energy conversion component is disposed at an upper surface of the radioactive source 21 in the cavity and is electrically connected to the first charge collecting component 25. A third energy conversion component is disposed at a lower surface of the radioactive source 21 in the cavity and is electrically connected to the second charge collecting component 23. The second and third energy conversion components each are a second radioluminescence component 42f. The second radioluminescence component 42f is further provided with an eighth output terminal 44f which is electrically connected to the second radioluminescence component 42f via an eighth output wire 43f. Thus, the second radioluminescence component 42f can absorb radiated particles as the radioactive source decays and convert the radiation energy into electrical output, thereby effectively improving the energy conversion efficiency and overcoming the deficiency of single transduction and large energy loss. The first charge collecting component 25 is configured to enrich the first charge 24 emitted by the radioactive source 21 and disposed at a lower surface of the second end region of the cantilever beam 11. The second charge collecting component 23 is configured to enrich the second charge 22 emitted by the radioactive source 21 and allow the second charge 22 enriched thereby to attract the first charge 24 enriched by the first charge collecting component 25 such that the second end region of the cantilever beam 11 moves toward the second charge collecting component 23 by the coulomb force. When the first charge collecting component 25 contacts with the second charge collecting component 23, the coulomb force disappears, and then the first and second charge collecting components separate (i.e. forming a cycle). Thus, the electrical output is generated by such reciprocating cycles. According to this embodiment, the second charge collecting component 23 is disposed at the housing 15 and corresponds to the first charge collecting component 25. The first thermoelectric conversion component 42 is disposed at an upper surface of the second end region of the cantilever beam 11, and a heat dissipation component 41 is disposed at a surface of the first thermoelectric conversion component 42. The first thermoelectric conversion component 42 is further provided with a second output terminal 44 which is electrically connected to the first thermoelectric conversion component 42 via a second output wire 43 to output electric energy converted from the thermal difference between the first thermoelectric conversion component 42 and the external temperature of the heat dissipation component 41. A buffing component 14 is further disposed on the inner surface of the housing 15 tightly, particularly disposed between the first gasket 12 and the second gasket 17. The second gasket 17 is provided with a nozzle 18 controlled by a valve 19 to allow the formation of a vacuous chamber. The nozzle 18 can be disposed at a center of the second gasket 17.

Figure 12:
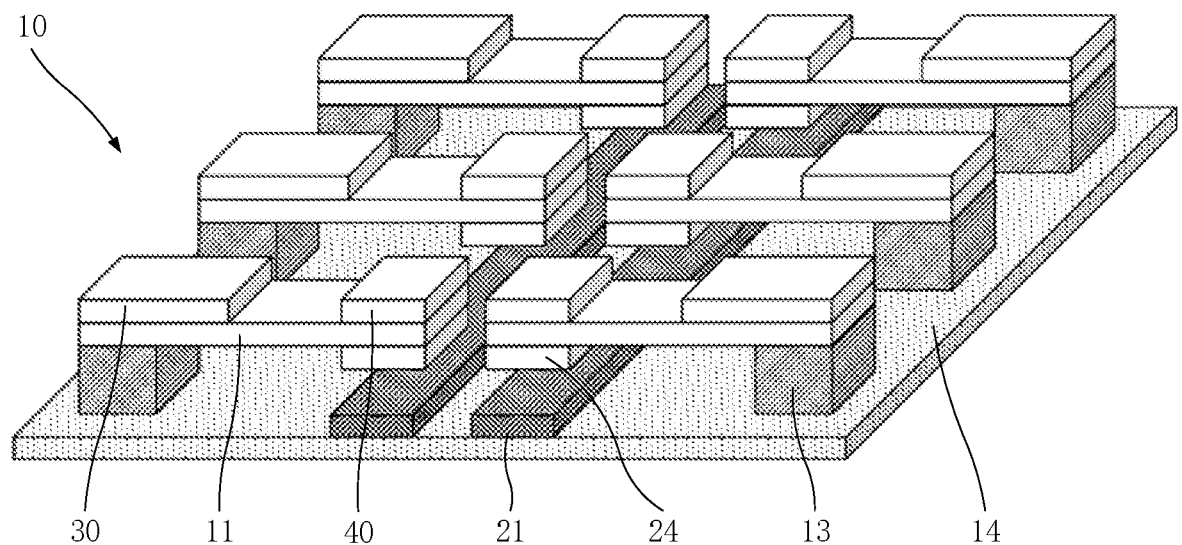
FIG. 12 is a schematic diagram showing the structure of integrated energy conversion devices in a triboluminescence isotope battery according to a further embodiment of the present disclosure.
Figure 13:
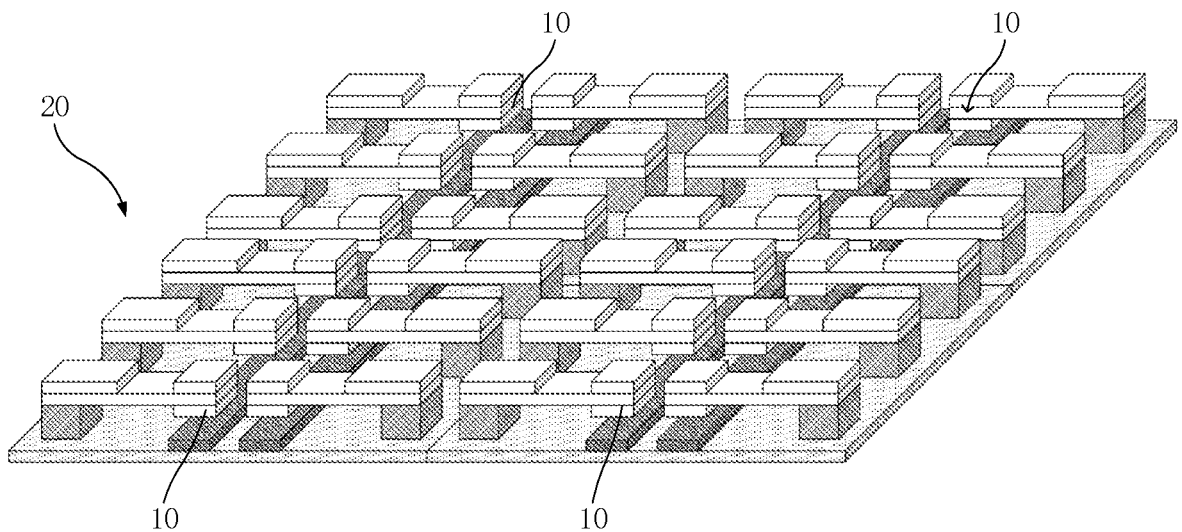
FIG. 13 is a schematic diagram showing the structure of integrated energy conversion devices in a triboluminescence isotope battery according to a further embodiment of the present disclosure.

According to embodiments of the present disclosure, referring to FIG. 12 and FIG. 13, the triboluminescence isotope battery is of multiple energy conversion devices 10 disposed in the chamber. In FIG. 12, the triboluminescence component 31 and the first photoelectric conversion component 32 constitute a triboluminescence unit 30. The first thermoelectric conversion component 42 and the heat dissipation component 41 constitute a first thermoelectric unit 40. Other details, such as the output wire and output terminal of respective components are not shown in FIG. 12. Thus, the different requirements for electric energy output of different isotope batteries can be satisfied.

According to embodiments of the present disclosure, referring to FIG. 12 and FIG. 13, the plurality of energy conversion devices 10 are arranged in an array along a circumferential direction of the inner surface of the housing, and adjacent two columns of the energy conversion devices 10, arranged in opposite such that the second end regions of the cantilever beams of one column of the energy conversion devices close to the second end regions of the cantilever beams of the other one column of the energy conversion devices, form a group of energy conversion devices. Thus, the triboluminescence isotope battery of the present disclosure can be made by a simple process, with a high integration degree.

According to embodiments of the present disclosure, multiple energy conversion devices connect with each other in series, parallel or the combination thereof for achievement of power management. Therefore, the circuit of the triboluminescence isotope battery can be flexibly designed by those skilled in the art according to actual needs in order to satisfy different usage requirements for different isotope batteries.

In addition, terms "first", "second" and the like are used herein for purposes of description and are not intended to indicate or imply relative importance or significance or impliedly indicate quantity of the technical feature referred to. Thus, the feature defined with "first", "second" and the like may explicitly or impliedly comprise one or more these features. In the description of the present disclosure, "a plurality of" means two or more than two these features unless specified otherwise.

In the present disclosure, the terms "disposed", "arranged", "connected", "fixed" and the like should be understood broadly, and may be either a fixed connection or a detachable connection, or an integration; may be a mechanical connection, or an electrical connection; may be directly connected, or connected via an intermediate medium; and may be the internal communication of two elements or the interaction of two elements, unless otherwise explicitly stated and defined. For those skilled in the art, the specific meanings of the above terms in the present disclosure can be understood according to specific situations.

In the present disclosure, a first feature "on" or "under" a second feature may refer to a direct contact of the first feature with the second feature or an indirect contact of the first feature and the second feature via an intermediate medium, unless otherwise explicitly stated and defined. Moreover, a first feature "above" a second feature may mean the first feature is right above or obliquely above the second feature, or merely that the first feature is located at a level higher than the second feature. A first feature "below" a second feature may mean the first feature is just below or obliquely below the second feature, or merely that the first feature is located at a level lower than the second feature.

Reference throughout this specification to "an embodiment", "one embodiment", "some embodiments", "an example", "a specific example" or "some examples" means that a particular feature, structure, material, or characteristic described in connection with the embodiment or example is included in at least one embodiment or example of the present disclosure. Thus, the appearances of the phrases such as "in some embodiments", "in one embodiment", "in an embodiment", "in an example", "in a specific example" or "in some examples" in various places throughout this specification are not necessarily referring to the same embodiment or example of the present disclosure. Furthermore, various embodiments or examples as well as features of the various embodiments or examples described in the description, may be combined by those skilled in the art without contradiction.

Although explanatory embodiments have been shown and described, it would be appreciated by those skilled in the art that the above embodiments cannot be construed to limit the present disclosure, and changes, alternatives, substitution and modifications can be made in the embodiments without departing from scope of the present disclosure.

What is claimed is:

1. A triboluminescence isotope battery, comprising
a housing, defining a chamber; and
one or more energy conversion devices disposed in the chamber, each energy conversion device comprising
a holder, disposed at the housing and in the chamber,
a cantilever beam, having a first end region fixed at the holder, and a second end region movable in the chamber,
a triboluminescence component, disposed at an upper surface of the first end region of the cantilever beam,
a first photoelectric conversion component, disposed at an upper surface of the triboluminescence component,
a radioactive source, disposed in the chamber and configured to emit a first charge and a second charge which have opposite polarity,
a first charge collecting component, configured to enrich the first charge and disposed at a lower surface of the second end region of the cantilever beam,
a second charge collecting component, configured to enrich the second charge and allow the second charge enriched thereby to attract the first charge enriched by the first charge collecting component such that the second end region of the cantilever beam moves toward the second charge collecting component,
a first thermoelectric conversion component, disposed at an upper surface of the second end region of the cantilever beam, and
a heat dissipation component, disposed at a surface of the first thermoelectric conversion component.

2. The triboluminescence isotope battery according to claim 1, wherein the second charge collecting component is disposed at the housing and comprises a first surface close to the first charge collecting component, and a second surface away from the first charge collecting component,
wherein the radioactive source is disposed at the first surface of the second charge collecting component.

3. The triboluminescence isotope battery according to claim 2, further comprising a first energy conversion component, disposed between the radioactive source and the second charge collecting component.

4. The triboluminescence isotope battery according to claim 3, wherein the first energy conversion component is any one of a second thermoelectric conversion component, a first radio-voltaic component and a first radioluminescence component.

5. The triboluminescence isotope battery according to claim 4, wherein the radio-voltaic component is made of a material selected from a group consisting of Ge, Si, InP, GaAs, GaP, SiC, $TiO_2$ nanotube array, ZnO, GaN, ZnS, SiCN, SiCN/Si, diamond and AlN, and
the radioluminescence component is made of a material selected from a group consisting of ZnS:Cu, ZnS:Ag, $SrAl_2O_4:Eu^{2+}$, $SrAl_2O_4:Dy^{2+}$ and $Y_2O_2S:Eu$.

6. The triboluminescence isotope battery according to claim 1, wherein the radioactive source and the second charge collecting component are integrated as a single component, and the triboluminescence isotope battery further comprises a first energy conversion component,
wherein the first energy conversion component is disposed between the single component and the housing.

7. The triboluminescence isotope battery according to claim 6, wherein the first energy conversion component is any one of a second thermoelectric conversion component, a first radio-voltaic component and a first radioluminescence component.

8. The triboluminescence isotope battery according to claim 7, wherein the radio-voltaic component is made of a material selected from a group consisting of Ge, Si, InP, GaAs, GaP, SiC, $TiO_2$ nanotube array, ZnO, GaN, ZnS, SiCN, SiCN/Si, diamond and AlN, and
the radioluminescence component is made of a material selected from a group consisting of ZnS:Cu, ZnS:Ag, $SrAl_2O_4:Eu^{2+}$, $SrAl_2O_4:Dy^{2+}$ and $Y_2O_2S:Eu$.

9. The triboluminescence isotope battery according to claim 1, wherein the holder is formed as a hollow structure which defines a cavity, the radioactive source is clamped in the cavity, and
a second energy conversion component is disposed at an upper surface of the radioactive source in the cavity, and is electrically connected to the first charge collecting component, and
a third energy conversion component is disposed at a lower surface of the radioactive source in the cavity, and is electrically connected to the second charge collecting component.

10. The triboluminescence isotope battery according to claim 9, wherein the second and third energy conversion components each are any one of a third thermoelectric conversion component, a second radio-voltaic component and a second radioluminescence component.

11. The triboluminescence isotope battery according to claim 10, wherein the radio-voltaic component is made of a material selected from a group consisting of Ge, Si, InP, GaAs, GaP, SiC, $TiO_2$ nanotube array, ZnO, GaN, ZnS, SiCN, SiCN/Si, diamond and AlN, and the radioluminescence component is made of a material selected from a group consisting of ZnS:Cu, ZnS:Ag, $SrAl_2O_4$:$Eu^{2+}$, $SrAl_2O_4$:$Dy^{2+}$ and $Y_2O_2S$:Eu.

12. The triboluminescence isotope battery according to claim 1, wherein a plurality of energy conversion devices are arranged in an array along a circumferential direction of the inner surface of the housing, and adjacent two columns of energy conversion devices, arranged in opposite such that the second end regions of the cantilever beams of one column of energy conversion devices close to the second end regions of the cantilever beams of the other one column of energy conversion devices, form a group of energy conversion devices.

13. The triboluminescence isotope battery according to claim 1, wherein a plurality of energy conversion devices are connected with each other in series, parallel or the combination thereof.

14. The triboluminescence isotope battery according to claim 1, wherein the housing is further provided with a first gasket and a second gasket at two ends respectively, and
wherein the second gasket is provided with a nozzle controlled by a valve.

15. The triboluminescence isotope battery according to claim 14, wherein for the energy conversion device adjacent to the first gasket, the first end region of the cantilever beam extends to and is embedded in the first gasket.

16. The triboluminescence isotope battery according to claim 1, wherein the inner surface of the housing is coated with a nano-lead plexiglass composite and further provided with a buffing component.

17. The triboluminescence isotope battery according to claim 1, wherein the radioactive source comprises at least one of an alpha radioactive source and a beta radioactive source,
wherein the alpha radioactive source is at least one selected from a group consisting of $^{210}$Po, Gd$^{210}$Po, Y$^{210}$Po, La$^{210}$Po, Ce$^{210}$Po, Pr$^{210}$Po, Nd$^{210}$Po, Sm$^{210}$Po, Eu$^{210}$Po, Tb$^{210}$Po, Dy$^{210}$Po, Ho$^{210}$Po, Er$^{210}$Po, Tm$^{210}$Po, Yb$^{210}$Po, Lu$^{210}$Po, Pm$^{210}$Po, Sc$^{210}$Po, Gd$^{210}$Po, Y$_3$$^{210}$Po, La$_3$$^{210}$Po, Ce$_3$$^{210}$Po, Pr$_3$$^{210}$Po, Nd$_3$$^{210}$Po, Sm$_3$$^{210}$Po, Eu$_3$$^{210}$Po, Tb$_3$$^{210}$Po, Dy$_3$$^{210}$Po, Ho$_3$$^{210}$Po, Er$_3$$^{210}$Po, Tm$_3$$^{210}$Po, Yb$_3$$^{210}$Po, Lu$_3$$^{210}$Po, $^{228}$Th, $^{228}$ThO$_2$, $^{235}$U, $^{238}$Pu, $^{238}$PuO$_2$ microsphere, $^{238}$PuO$_2$—Mo ceramic, $^{238}$PuO$_2$ fuel ball, $^{238}$PuO$_2$ ceramic, $^{238}$Pu—Zr alloy, $^{238}$Pu—Ga alloy, $^{238}$Pu—Pt alloy, $^{238}$Pu—Sc alloy, $^{238}$PuN, $^{238}$PuC, $^{241}$Am, $^{242}$Cm, $^{242}$Cm$_2$O$_3$, $^{244}$Cm and $^{244}$Cm$_2$O$_3$, and
the beta radioactive source is at least one selected from a group consisting of $(C_4H_3{}^3H_5-)_n$, Sc$^3$H$_2$, $^{14}$C, $^{35}$S, $^{63}$Ni, $^{90}$Sr, $^{90}$Sr/$^{90}$Y, $^{90}$SrTiO$_3$, $^{90}$SrNO$_3$, $^{90}$SrNO$_3$/dicyclohexano-18-crown ether-6, $^{106}$Ru, $^{137}$Cs, $^{137}$CsCl, $^{144}$Ce, $^{144}$CeO$_2$, $^{147}$Pm, $^{147}$Pm$_2$O$_3$ and $^{151}$Sm.

18. The triboluminescence isotope battery according to claim 1, wherein the triboluminescence component is made of a material selected from a group consisting of sucrose, D-glucose, lactose, maltose, L-rhamnose, tartaric acid, lithium acetate, potassium hydrogen malonate, vitamin C, sorbitol hexaacetate, phthalic acid, coumarin, acenaphthene, 9-anthracenemethanol based material, polybutadiene, epoxy resin, europium vanadium, copper vanadium, tetrahedral manganese complex, $(NH_4)_2C_2O_4$, $LiSO_4.H_2O$, $Ce(SO_4)_3.8H_2O$, $Zn(NO_3)_2.6H_2O$, $(UO_2)(NO_3)_2.6H_2O$, SiC, Si, InP, GaAs, Ge, diamond, MgO, CaO, SrO, NaF, LiF, NaCl, KCl, KI, CsI, RbI, KBr, RbBr, $BaAl_2Si_2O_8$ based material, $Sr_3Al_2O_6$ based material, $SrAl_2O_4$ based material, $Ca_2SrMgSi_2O_7$ based material, $Ca_2MgSi_2O_7$ based material, $SrMgAl_{10}O_{17}$ based material, $Sr_2Mg_2(PO_4)_2$ based material, BaFCl based material, BaFBr based material, $K_2Mg_2(SO_4)_3$ based material, $BaSi_2O_2N_2$ based material, $CaO.Nb_2O_5$ based material, $ZnGa_2O_4$ based material, $MgGa_2O_4$ based material, $ZnAl_2O_4$ based material, $LiNbO_3$ based material, $SrAl_2O_4$ based material and ZnS based material.

19. The triboluminescence isotope battery according to claim 1, wherein the first photoelectric conversion component is made of a material selected from a group consisting of Si, GaAs, InP, GaInP, $CuInGaSe_2$, $CuInSe_2$, CdS, CdTe, dye sensitizing material, polymer material and quantum dot material.

20. The triboluminescence isotope battery according to claim 1, wherein the thermoelectric conversion component is made of a material selected from a group consisting of $Bi_2Te_3$ based material, $Sb_2Se_3$ based material, $Sb_2Te_3$ based material, BiSb based material, $Zn_4Sb_3$ based material, $Mg_3Sb_2$ based material and $Sb_2Se_3$ based material.

* * * * *